United States Patent
Sharon et al.

(10) Patent No.: US 8,458,563 B2
(45) Date of Patent: Jun. 4, 2013

(54) READING A FLASH MEMORY BY JOINT DECODING AND CELL VOLTAGE DISTRIBUTION TRACKING

(75) Inventors: Eran Sharon, Rishon Lezion (IL); Idan Alrod, Herzliya (IL); Simon Litsyn, Giv'at Shmuel (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 1083 days.

(21) Appl. No.: 12/407,098

(22) Filed: Mar. 19, 2009

(65) Prior Publication Data

US 2009/0319868 A1    Dec. 24, 2009

Related U.S. Application Data

(60) Provisional application No. 61/074,698, filed on Jun. 23, 2008.

(51) Int. Cl.
*G06F 11/00* (2006.01)

(52) U.S. Cl.
USPC .......................... 714/763; 714/752; 714/746

(58) Field of Classification Search
USPC ..................................................... 714/763
See application file for complete search history.

(56) References Cited

U.S. PATENT DOCUMENTS

| | | | |
|---|---|---|---|
| 5,559,956 A * | 9/1996 | Sukegawa | 714/6.13 |
| 6,781,877 B2 | 8/2004 | Cernea et al. | |
| 6,862,218 B2 * | 3/2005 | Guterman et al. | 365/185.24 |
| 7,023,735 B2 | 4/2006 | Ban et al. | |
| 7,388,781 B2 | 6/2008 | Litsyn et al. | |
| 7,526,715 B2 | 4/2009 | Litsyn | |
| 7,995,387 B2 | 8/2011 | Sharon et al. | |
| 2004/0015765 A1 * | 1/2004 | Cooper et al. | 714/750 |
| 2007/0086239 A1 | 4/2007 | Litsyn | |
| 2007/0091677 A1 | 4/2007 | Lasser et al. | |
| 2007/0124652 A1 | 5/2007 | Litsyn | |
| 2008/0065947 A1 * | 3/2008 | Eroz et al. | 714/752 |
| 2008/0077841 A1 * | 3/2008 | Gonzalez et al. | 714/763 |

(Continued)

FOREIGN PATENT DOCUMENTS

| WO | WO 2007/046084 A2 | 4/2007 |
|---|---|---|
| WO | WO 2007/080586 A2 | 7/2007 |
| WO | WO 2007/132457 | 11/2007 |

OTHER PUBLICATIONS

S.M.Kay, Fundamentals of Statistical Signal Processing: Estimation Theory, Prentice-Hall Inc., chapters 10-12, 1993.

Y. Nana et al., Improved Decoding of LDPC Codes for Multilevel Modulations, IEEE Communication Letters, vol. 10, pp. 375-377, May 2006.

F.R. Kschischang et al., Factor Graphs and the Sum-Product Algorith, IEEE Transactions on Information Theory, vol. 47, pp. 498-519, Feb. 2001.

(Continued)

*Primary Examiner* — Scott Baderman
*Assistant Examiner* — Sarai Butler
(74) *Attorney, Agent, or Firm* — Alston & Bird LLP

(57) ABSTRACT

To read a plurality of memory cells, each cell is assigned to a respective cell population. A respective value of an operational parameter of each cell is measured. Each cell is assigned an a-priori metric based at least in part on one or more CVD parameter values of the cell's population. The a-priori metrics are decoded. Based at least in part on the resulting a-posteriori metrics, the CVD parameter values are corrected, without repeating the measurements of the cell operational parameter values. The operational parameter values are indicative of bit patterns stored in the cells, and the correction of the CVD parameter values is constrained by requiring the bit patterns collectively to be a valid codeword.

52 Claims, 6 Drawing Sheets

U.S. PATENT DOCUMENTS

| | | |
|---|---|---|
| 2008/0148128 A1 | 6/2008 | Sharon et al. |
| 2008/0151618 A1 | 6/2008 | Sharon et al. |
| 2008/0215798 A1 | 9/2008 | Sharon et al. |
| 2008/0244368 A1 | 10/2008 | Chin et al. |
| 2008/0263265 A1 | 10/2008 | Litsyn |
| 2008/0294960 A1 | 11/2008 | Sharon |
| 2009/0024905 A1 | 1/2009 | Shalvi et al. |
| 2009/0080259 A1* | 3/2009 | Alrod et al. .............. 365/185.18 |
| 2009/0106626 A1 | 4/2009 | Hou et al. |

OTHER PUBLICATIONS

Office Action in U.S. Appl. No. 12/645,499 dated Mar. 27, 2012.
International Search Report and Written Opinion for Application No. PCT/IB2009/051233 dated Jun. 24, 2009.
International Preliminary Report on Patentability for Application No. PCT/IB2009/051233 dated Jan. 5, 2011.

* cited by examiner

READING A FLASH MEMORY BY JOINT DECODING AND CELL VOLTAGE DISTRIBUTION TRACKING

This patent application claims the benefit of U.S. Provisional Patent Application No. 61/074,698 riled Jun. 23, 2008.

FIELD AND BACKGROUND OF THE INVENTION

Disclosed herein are methods of reading the cells of a memory and related memory devices, memory controllers and memory systems.

Various physical phenomena occurring in flash memories result in corruption of the stored information. These phenomena include programming noises, read noises, charge leakage over time, wearing of the memory cells due to program and erase cycles etc. In order to allow reliable operation of a flash memory under these conditions, redundant data are stored together with the information, allowing one to correct the errors that corrupted the stored information.

An efficient scheme for inferring the information stored in a flash memory from the read data should provide maximal error correction capability (i.e. allow inferring the stored information under the most severe flash memory noise conditions possible given that a fixed amount of redundant data is used). This allows efficient utilization of the flash memory because a minimal amount of redundancy needs to be used in order to provide reliable storage under given flash memory noise conditions.

Conventionally, the following solutions to this problem have been applied:

1) Tracking Cell Voltage Distributions (CVD)

The statistical distribution of the threshold voltages (or the read voltages) of programmed cells is not fixed for all cells and is not fixed over time. The CVD may change between devices, blocks or pages. The CVD can change as a function of threshold voltages of neighboring cells along the word line (WL) or bit line (BL) due to cross coupling effects or to program disturb (PD) effects More importantly, the CVD can change over time, due to wearing of the cells by program/erase cycles and due to charge leakage. Knowing the CVD of the cell population to which a read cell belongs is important for several reasons:

A. The CVD can be used for determining optimal reading thresholds that should be used when reading the cell, which will result in a minimal error probability in determining the programmed cell state.

B. The CVD can be used for calibrating Error Correction Code (ECC) parameters and inputs—computing accurate bit estimations which are used as an input for a soft ECC decoder requires knowing the actual CVD model and parameters. Moreover, the CVD provides an indication of the flash memory noises that affect the cell and the expected cell error rate (i.e. the probability that the cell is read at a state different from the state it was programmed to).

This can be used in order to determine the required decoding mode, as taught for example in US Patent Application Publication No. 2007/0124652 and in U.S. patent application Ser. No. 12/124,192, and in order to determine the required reading resolution (higher reading resolution incurs a time and energy consumption penalties and is not required if low error probability is expected).

Various conventional schemes for CVD tracking are known. CVD tracking schemes for compensating charge leakage effects due to program/erase wearing and time are described in U.S. patent application Ser. No. 11/941,945. These schemes can be performed in a "blind" manner in which the cells' programmed states are unknown and CVD parameters estimation is done by analyzing the empirical histogram of read voltages of a group of cells (for example the cells of one page). Alternatively, CVD parameter estimation can be performed based on reference cells that are programmed to known states and are assumed to have the same CVD as the data cells A disadvantage of the use of reference cells is that it requires allocating specific cells for CVD tracking which cannot be used for storing data. CVD tracking schemes for compensating the electric field effect of neighboring cells are described in U.S. patent application Ser. No. 11/860,553 and in U.S. patent application Ser. No. 12/363,554. In these schemes the parameters of the CVD of a cell are updated according to the read to voltages of neighboring cells.

2) Compute Soft Bit Estimations

State of the art ECCs can utilize reliability information on the stored bits in order to improve error correction capability. Such "soft" bit estimations can be computed based on knowing the CVD (i.e. a statistical model for CVD) and its parameters). The more accurately the CVD is estimated, the more accurate the soft bit estimations can be. This is why CVD tracking is important. The "soft" information also becomes more accurate when higher resolution reading is used (i.e. when the cell threshold voltage is determined more accurately). Conventional soft bit estimation is described in US Patent Application Publication No. 2007/0086239, in U.S. patent application Ser. No. 11/941,945 and in U.S. patent application Ser. No. 11/860,553.

3) Efficient ECC

Using an efficient ECC that can utilize soft information and that allows correcting maximal number of bit errors with a given ECC redundancy. Examples of conventional ECC use is taught in US 2007/0124652 and in U.S. patent application Ser. No. 12/124,192.

Conventionally, the three mechanisms described above are applied separately, one after another, i.e. first CVD tracking is performed, then a page is read based on the CVD parameters, then soft estimations of the stored bits are computed based on the CVD parameters, and finally ECC decoding is performed on the soft bit estimates.

To summarize, the conventional approach is:

1) CVD tracking computes CVD parameters based only on the read cell voltages.

2) Soft bit estimates for a given cell are computed based only on the read cell voltages and the estimated CVD parameters.

3) Estimates of the stored bits are computed using an ECC decoder which operates only on soft bit estimates.

SUMMARY OF THE INVENTION

The conventional separation between CVD tracking, soft bit estimates computation and ECC decoding results in a suboptimal scheme with degraded error correction capability.

Described herein is a scheme that performs joint CVD tracking and ECC decoding. One difference between this scheme and the conventional approach is that according to the scheme described herein the CVD parameters are computed as a function of the read cell voltages under the assumption that the bits stored in the cells belong to valid ECC codewords (relative to the codebook of codewords that is used for encoding the stored data), while conventionally no such assumption is made about the stored bits.

According to some embodiments of the scheme, an iterative scheme is used such that CVD tracking block and ECC decoding blocks exchange information iteratively. In these embodiments, one feature that differentiates the scheme from the prior art is the use of feedback from the ECC decoder to the CVD tracking. More specifically, at least for some cells the CVD parameters are computed a second time based on ECC decoder outputs and at least some bit estimates are updated in a second ECC decoding step based on the updated CVD parameters.

One embodiment provided herein is a method of reading a plurality of memory cells, including: (a) assigning each cell to a respective one of a plurality of cell populations; (b) measuring a respective value of an operational parameter of each cell; (c) providing a value of at least one first respective cell distribution model parameter of each population; (d) assigning each cell a respective a priori metric, based at least in part on the respective at least one cell distribution model parameter value of the cell's respective population; (e) decoding the a priori metrics, thereby providing, for each cell, a respective a posteriori metric; and (f) based at least in part on the a posteriori metrics, and without repeating the measuring of the respective values of the operational parameters: estimating a value of at least one second respective cell distribution model parameter of each population.

Another embodiment provided herein is a memory device including: (a) a plurality of cells; (b) circuitry for measuring a respective value of an operational parameter of each cell; and (c) a controller operative: (i) to instruct the circuitry to measure the values of the operational parameters, (ii) to assign each cell to a respective one of a plurality of cell populations, (iii) to provide a value of at least one first respective cell distribution model parameter of each population, (iv) to assign each cell a respective a priori metric, based at least in part on the respective at least one cell distribution model parameter value of the cell's respective population; (v) to decode the a priori metrics, thereby providing, for each cell, a respective a posteriori metric, and (vi) to estimate a value of at least one second respective cell distribution model parameter of each population, based at least in part on the a posteriori metrics and without repeating the instructing of the circuitry to measure the operational parameter values.

Another embodiment provided herein is a memory controller, for a memory that includes a plurality of cells, the memory controller including: (a) a measurement functional block for obtaining from the memory, for each cell, a measurement of a respective value of an operational parameter of the cell; (b) an assignment functional block for assigning each cell to a respective one of a plurality of cell populations; (c) an a priori metric functional block for assigning each cell a respective a priori metric; (d) a decoder for decoding the a priori metrics, thereby providing, for each cell, a respective a posteriori metric; and (e) a cell distribution model functional block for: (i) providing a value of at least one first respective cell distribution model parameter of each population, the a priori metric of each cell then being based at least in part on the respective at least one cell distribution model parameter value of the cell's respective population, and (ii) estimating a value of at least one second respective cell distribution model parameter of each population, based at least in part on the a posteriori metrics and without repeating the obtaining of the operational parameter value measurements from the memory.

Another embodiment provided herein is a system for managing a first memory that includes a plurality of cells, the system including: (a) a second memory for storing code for: (i) obtaining, from the first memory, for each cell, a measurement of a respective value of an operational parameter of the cell; (ii) assigning each cell to a respective one of a plurality of cell populations, (iii) providing a value of at least one first respective cell distribution model parameter of each population, (iv) assigning each cell a respective a priori metric, based at least in part on the respective at least one cell distribution model parameter value of the cell's respective population, (v) decoding the a priori metrics, thereby providing, for each cell, a respective a posteriori metric, and (vi) estimating a value of at least one second respective cell distribution model parameter of each population, based at least in part on the a posteriori metrics, and without repeating the obtaining of the operational parameter value measurements from the first memory; and (b) a processor for executing the code.

Another embodiment provided herein is a computer readable storage medium having computer readable code embodied on the computer readable storage medium, the computer readable code for managing a memory that includes a plurality of cells, the computer readable code including: (a) program code for obtaining from the memory, for each cell, a measurement of a respective value of an operational parameter of the cell; (b) program code for assigning each cell to a respective one of a plurality of cell populations; (c) program code for assigning each cell a respective a priori metric; (d) program code for decoding the a priori metrics, thereby providing, for each cell, a respective a posteriori metric; and (e) program code for: (i) providing a value of at least one first respective cell distribution model parameter of each population, the a priori metric of each cell then being based at least in part on the respective at least one cell distribution model parameter value of the cell's respective population, and (ii) estimating a value of at least one second respective cell distribution model parameter of each population, based at least in part on the a posteriori metrics and without repeating the obtaining of the operational parameter value measurements from the memory.

Another embodiment provided herein is a method of reading a plurality of memory cells, including: (a) measuring a respective value of an operational parameter of each cell; (b) providing a value of at least one first cell distribution model parameter of the plurality of memory cells; (c) assigning each cell a respective a priori metric, based at least in part on the at least one first cell distribution model parameter value; (d) decoding the a priori metrics, thereby providing, for each cell, a respective a posteriori metric; and (e) based at least in part on the a posteriori metrics, and without repeating the measuring of the respective values of the operational parameters, estimating a value of at least one second cell distribution model parameter of the plurality of memory cells.

Another embodiment provided herein is a memory device including: (a) a plurality of cells; (b) circuitry for measuring a respective value of an operational parameter of each cell; and (c) a controller operative: (i) to instruct the circuitry to measure the values of the operational parameters, (ii) to provide a value of at least one first cell distribution model parameter of the plurality of cells, (iii) to assign each cell a respective a priori metric, based at least in part on the at least one cell distribution model parameter value; (iv) to decode the a priori metrics, thereby providing, for each cell, a respective a posteriori metric, and (v) to estimate a value of at least one second respective cell distribution model parameter of the plurality of cells, based at least in part on the a posteriori metrics and without repeating the instructing of the circuitry to measure the operational parameter values.

Another embodiment provided herein is a memory controller, for a memory that includes a plurality of cells, the memory controller including: (a) a measurement functional block for obtaining from the memory, for each cell, a measurement of a respective value of an operational parameter of the cell; (b) an a priori metric functional block for assigning each cell a respective a priori metric; (c) a decoder for decoding the a priori metrics, thereby providing, for each cell, a respective a posteriori metric; and (d) a cell distribution model functional block for: (i) providing a value of at least one first cell distribution model parameter of the plurality of cells, the a priori metric of each cell then being based at least in part on the at least one cell distribution model parameter value, and (ii) estimating a value of at least one second respective cell distribution model parameter of the plurality of cells, based at least in part on the a posteriori metrics and without repeating the obtaining of the operational parameter value measurements from the memory.

Another embodiment provided herein is a system for managing a first memory that includes a plurality of cells, the system including: (a) a second memory for storing code for: (i) obtaining, from the first memory, for each cell, a measurement of a respective value of an operational parameter of the cell; (ii) providing a value of at least one first cell distribution model parameter of the plurality of cells, (iii) assigning each cell a respective a priori metric, based at least in part on the at least one cell distribution model parameter value, (iv) decoding the a priori metrics, thereby providing, for each cell, a respective a posteriori metric, and (v) estimating a value of at least one second respective cell distribution model parameter of the plurality of cells, based at least in part on the a posteriori metrics, and without repeating the obtaining of the operational parameter value measurements from the first memory; and (b) a processor for executing the code.

Another embodiment provided herein is a computer readable storage medium having computer readable code embodied on the computer readable storage medium, the computer readable code for managing a memory that includes a plurality of cells, the computer readable code including: (a) program code for obtaining from the memory, for each cell, a measurement of a respective value of an operational parameter of the cell; (b) program code for assigning each cell a respective a priori metric; (c) program code for decoding the a priori metrics, thereby providing, for each cell, a respective a posteriori metric; and (d) program code for: (i) providing a value of at least one first cell distribution model parameter of the plurality of cells, the a priori metric of each cell then being based at least in part on the at least one cell distribution model parameter value, and (ii) estimating a value of at least one second cell distribution model parameter based at least in part on the a posteriori metrics and without repeating the obtaining of the operational parameter value measurements from the memory.

Another embodiment provided herein is a method of reading a plurality of memory cells including: (a) for each cell: (i) measuring a respective value, of an operational parameter of the cell, that is indicative of a bit pattern stored in the cell, and (ii) assigning the cell to a respective one of a plurality of cell populations; (b) estimating a value of at least one respective cell distribution model parameter of each cell population: and (c) constraining the estimating by requiring the bit patterns collectively to be a valid error correction codeword without repeating the measuring of the respective values of the operational parameters of any of the cells.

Another embodiment provided herein is a memory device including: (a) a plurality of cells; (b) circuitry for measuring a respective value, of an operational parameter of each cell, that is indicative of a bit pattern stored in the cell; and (c) a controller operative: (i) to instruct the circuitry to measure the values of the operational parameters, (ii) to assign each cell to a respective one of a plurality of cell populations, and (iii) to estimate a value of at least one respective cell distribution model parameter of each cell population, the estimating being constrained by requiring the bit patterns collectively to be a valid error correction codeword without repeating the instructing of the circuitry to measure the operational parameter values.

Another embodiment provided herein is a memory controller, for a memory that includes a plurality of cells, the memory controller including: (a) a measurement functional block for obtaining from the memory, for each cell, a measurement of a respective value, of an operational parameter of the cell, that is indicative of a bit pattern stored in the cell; (b) an assignment functional block for assigning each cell to a respective one of a plurality of cell populations; and (c) an estimation functional block for estimating a value of at least one respective cell distribution model parameter of each cell population, the estimating being constrained by requiring the bit patterns collectively to be a valid error correction codeword without repeating the measurement of the operational parameter values.

Another embodiment provided herein is a system for managing a first memory that includes a plurality of cells, the system including: (a) a second memory for storing code for: (i) obtaining, from the first memory, for each cell, a measurement of a respective value, of an operational parameter of the cell, that is indicative of a bit pattern stored in the cell; (ii) assigning each cell to a respective one of a plurality of cell populations, and (iii) estimating a value of at least one respective cell distribution model parameter of each cell population, the estimating being constrained by requiring the bit patterns collectively to be a valid error correction codeword without repeating the measurement of the operational parameter values; and (b) a processor for executing the code.

Another embodiment provided herein is a computer readable storage medium having computer readable code embodied on the computer readable storage medium, the computer readable code for managing a memory that includes a plurality of cells, the computer readable code including: (a) program code for obtaining from the memory, for each cell, a measurement of a respective value, of an operational parameter of the cell, that is indicative of a bit pattern stored in the cell; (b) program code for assigning each cell to a respective one of a plurality of cell populations; and (c) program code for estimating a value of at least one respective cell distribution model parameter of each cell population, the estimating being constrained by requiring the bit patterns collectively to be a valid error correction codeword without repeating the measurement of the operational parameter values.

Another embodiment provided herein is a method of reading a plurality of memory cells, including. (a) for each cell, measuring a respective value, of an operational parameter of the cell, that is indicative of a bit pattern stored in the cell; (b) estimating a value of at least one cell voltage distribution parameter of the plurality of memory cells; and (c) constraining the estimating by requiring the bit patterns collectively to be a valid error correction codeword without repeating the measuring of the respective values of the operational parameters of any of the cells.

Another embodiment provided herein is a memory device including: (a) a plurality of cells; (b) circuitry for measuring a respective value, of an operational parameter of each cell, that is indicative of a bit pattern stored in the cell; and (c) a controller operative: (i) to instruct the circuitry to measure the values of the operational parameters, and (ii) to estimate a value of at least one cell distribution model parameter of the plurality of cells, the estimating being constrained by requiring the bit patterns collectively to be a valid error correction codeword without repeating the instructing of the circuitry to measure the operational parameter values.

Another embodiment provided herein is a memory controller, for a memory that includes a plurality of cells, the memory controller including: (a) a measurement functional block for obtaining from the memory, for each cell, a measurement of a respective value, of an operational parameter of the cell, that is indicative of a bit pattern stored in the cell; and (b) an estimation functional block for estimating a value of at least one cell distribution model parameter of the plurality of cells, the estimating being constrained by requiring the bit patterns collectively to be a valid error correction codeword without repeating the measurement of the operational parameter values.

Another embodiment provided herein is a system for managing a first memory that includes a plurality of cells, the system including. (a) a second memory for storing code for: (i) obtaining, from the first memory, for each cell, a measurement of a respective value, of an operational parameter of the cell, that is indicative of a bit pattern stored in the cell; and (ii) estimating a value of at least one cell distribution model parameter of the plurality of cells, the estimating being constrained by requiring the bit patterns collectively to be a valid error correction codeword without repeating the measurement of the operational parameter values; and (b) a processor for executing the code.

Another embodiment provided herein is a computer readable storage medium having computer readable code embodied on the computer readable storage medium, the computer readable code for managing a memory that includes a plurality of cells, the computer readable code including: (a) program code for obtaining from the memory, for each cell, a measurement of a respective value, of an operational parameter of the cell, that is indicative of a bit pattern stored in the cell; and (b) program code for estimating a value of at least one cell distribution model parameter of the plurality of cells, the estimating being constrained by requiring the bit patterns collectively to be a valid error correction codeword without repeating the measurement of the operational parameter values.

Four general methods are presented herein for joint CVD estimation and error correction in the reading of a plurality of cells of a memory such as a flash memory.

According to the first general method, each cell is assigned to a respective one of a plurality of cell populations, i.e., to a subset of the cells that are disturbed similarly by their neighbors. A respective value of an operational parameter such as a threshold voltage is measured for each cell. (A) value(s) of one or more first respective cell distribution model parameter(s) is/are provided for each cell population, for example by conventional CVD tracking or from a default model. Each cell is assigned a respective a priori metric based at least in part on the respective distribution model parameter value(s) of the cell's respective population. The a priori metrics are decoded, thereby providing, for each cell, a respective a posteriori metric. (A) value(s) of one or more second respective cell distribution model parameter(s) is/are estimated for each cell population, based at least in part on the a posteriori metrics and without repeating the measuring of the respective values of the operational parameters.

In a typical embodiment of the first general method, for one or more of the cell populations, the providing of the value(s) of the first respective cell distribution model parameter for that population is based at least in part on measured values of the operational parameters of the cells of that population.

In typical embodiments of the first general method, the assigning of each cell to its respective population is at least in part according to estimated cross-coupling of the cell with one or more neighboring cells and/or according to estimated program disturb of the cell by one or more neighboring cells and/or according to (a) respective measured value(s) of an operational parameter of one or more neighboring cells.

In a typical embodiment of the first general method, for at least one of the populations, the first and second cell distribution model parameters are identical. Alternatively, for at least one of the populations, the first and second cell distribution model parameters are different.

A memory controller, for implementing the first general method for a memory that includes a plurality of cells, includes five functional blocks. The first functional block is a measurement functional block for obtaining, for each cell of the plurality of cells, a measurement of a respective value of an operational parameter of the cell. The second functional block is an assignment functional block for assigning each cell to a respective one of a plurality of cell populations. The third functional block is an a priori metric functional block for assigning each cell of the plurality of cells a respective a priori metric. The fourth functional block is a decoder for decoding the a priori metrics, thereby providing, for each cell of the plurality of cells, a respective a posteriori metric. The fifth functional block is a cell distribution model functional block for providing a value of one or more first respective cell distribution model parameters of each population, with the a priori metric of each cell of the plurality of cells then being based at least in part on the respective cell distribution model parameter value(s) of the cell's respective population, and for estimating a value of one or more second respective cell distribution model parameters of each population, based at least in part on the a posteriori metrics and without repeating the obtaining of the operational parameter value measurements from the memory.

According to the second general method, a respective value of an operational parameter such as a threshold voltage is measured for each cell. (A) value(s) of one or more first cell distribution model parameter(s) is/are provided for the plurality of cells, for example by conventional CVD tracking or from a default model. Each cell is assigned a respective a priori metric based at least in part on the cell distribution model parameter value(s). The a priori metrics are decoded, thereby providing, for each cell, a respective a posteriori metric. (A) value(s) of one or more second respective cell distribution model parameter(s) is/are estimated for the plurality of cells, based at least in part on the a posteriori metrics and without repeating the measuring of the respective values of the operational parameters.

In a typical embodiment of the second general method, the providing of the value(s) of the first cell distribution model parameter is based at least in part on the measured values of the operational parameters.

Typical embodiments of the second general method also include the step of correcting the respective values of the operational parameters for cross coupling and/or for program disturb, based at least in part on the first cell distribution model parameter value(s). The assigning of the respective a priori metrics is based at least in part on the corrected values of the operational parameters.

Some embodiments of the second general method also include the step of correcting each cell's respective value of its operational parameter, based at least in part on the first cell distribution parameter value(s) and on (a) respective measured value(s) of (an) operational parameter(s) of (a) neighboring cell(s). The assigning of the respective a priori metrics is based at least in part on the corrected respective values of the operational parameters.

In typical embodiments of the first or second general method, a representation of an error correction codeword is stored in the cells, and the estimating is contingent on the decoding failing to produce a valid error correction codeword. (If the decoding produces a valid error correction codeword, there is no need for the values of the second respective cell distribution model parameters.) What is stored in the cells when the cells are read is, in general, only a representation of a valid error correction codeword, and not a valid error correction codeword, because the error correction codeword, as stored initially, may have become corrupted. This, indeed, is why error correction is needed.

In typical embodiments of the first or second general method, the decoding also provides, for each cell, a respective estimate of at least one bit that is stored in the cell.

In typical embodiments of the first or second general method, the a posteriori metrics are extrinsic a posteriori metrics.

In typical embodiments of the first or second general method, the metrics include log likelihood ratios.

In typical embodiments of the first or second general method, the metrics are cell state metrics. Alternatively, the metrics are bit metrics.

In typical embodiments of the first or second general method, the assigning of the a priori metrics includes at least partial cancellation of cross coupling among the cells.

In a typical embodiment of the second general method the first and second cell distribution model parameters are identical. Alternatively, the first and second cell distribution model parameters are different.

A memory controller, for implementing the second general method for a memory that includes a plurality of cells, includes four functional blocks. The first functional block is a measurement functional block for obtaining, for each cell of the plurality of cells, a measurement of a respective value of an operational parameter of the cell. The second functional block is an a priori metric functional block for assigning each cell of the plurality of cells a respective a priori metric. The third functional block is a decoder for decoding the a priori metrics, thereby providing, for each cell of the plurality of cells, a respective a posteriori metric. The fourth functional block is a cell distribution model functional block for providing a value of one or more first cell distribution model parameters, with the a priori metric of each cell then being based at least in part on the cell distribution model parameter value(s), and for estimating a value of one or more second cell distribution model parameters, based at least in part on the a posteriori metrics and without repeating the obtaining of the operational parameter value measurements from the memory.

According to the third general method, for each cell, a respective value of an operational parameter of the cell, such as a threshold voltage of the cell, that is indicative of a bit pattern stored in the cell, is measured. Each cell is assigned to a respective one of a plurality of cell populations. Values of one or more respective cell distribution model parameters of each cell population are estimated. The estimations are constrained by requiring the bit pattern collectively to be a valid error correction codeword without repeating the measuring of the respective values of the operational parameters of any of the cells.

In a typical embodiment of the third general method, for at least one population, the estimating of the value of the respective cell distribution model parameter(s) of that population is based at least in part on the measured values of the operational parameters of the cells of that population.

A memory controller, that corresponds to the third general method for a memory that includes a plurality of cells, includes three functional blocks. The first functional block is a measurement functional block for obtaining, for each cell of the plurality of cells, a measurement of a respective value of an operational parameter of the cell that is indicative of a bit pattern stored in the cell. The second functional block is an assignment functional block for assigning each cell of the plurality of cells to a respective one of a plurality of cell populations. The third functional block is an estimation functional block for estimating values of one or more respective cell distribution parameters of each cell population. The estimating is constrained by requiring the bit patterns collectively to be a valid error correction codeword without repeating the measurement of the operational parameter values.

According to the fourth general method, for each cell, a respective value of an operational parameter of the cell, such as a threshold voltage of the cell, that is indicative of a bit pattern stored in the cell, is measured. Values of one or more cell distribution model parameters are estimated. The estimations are constrained by requiring the bit pattern collectively to be a valid error correction codeword without repeating the measuring of the respective values of the operational parameters of any of the cells.

In a typical embodiment of the fourth general method, the estimating of the is value of the cell distribution model parameter(s) is based at least in part on the measured values of the operational parameters of the cells.

A memory controller that corresponds to the fourth general method, for a memory that includes a plurality of cells, includes two functional blocks. The first functional block is a measurement functional block for obtaining, for each cell of the plurality of cells, a measurement of a respective value of an operational parameter of the cell that is indicative of a bit pattern stored in the cell. The second functional block is an estimation functional block for estimating values of one or more cell distribution parameters. The estimating is constrained by requiring the bit patterns collectively to be a valid error correction codeword without repeating the measurement of the operational parameter values.

A memory device that corresponds to one of the four general methods includes a plurality of cells, circuitry for measuring a respective value of an operational parameter of each cell, and a controller operative to implement the relevant general method.

A system, for managing a first memory that includes a plurality of cells, that corresponds to one of the four general methods, includes a second memory and a processor. The second memory is for storing code for implementing the relevant general method. The processor executes the code. A computer readable storage medium that corresponds to one of the four general methods has embedded thereon computer code for managing a memory that includes a plurality of cells using the relevant general method.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

Figure 1:
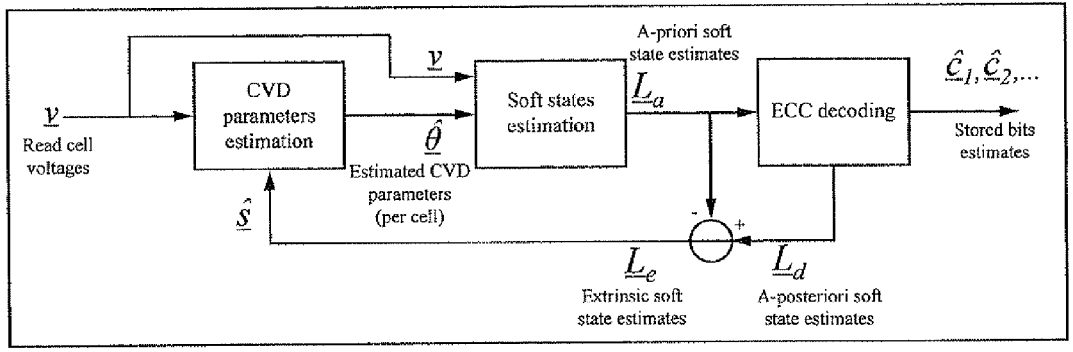
FIG. 1 is a schematic diagram of iteration between CVD parameter computation and ECC decoding without separate cancellation of cross-coupling.

The principles and operation of joint CVD estimation and ECC according to the present invention may be better understood with reference to the drawings and the accompanying description.

Let us assume that we are using an error correction code C, such that each set of information bits is mapped into a valid codeword c∈C. Furthermore, assume that a set of valid codewords is stored in a set of M cells. This is done by mapping the codewords into a vector s=[$s_1$ $s_2$ ... $s_M$], such that $s_i$∈S and S={$S_1, S_2, \ldots, S_L$} and L is the number of levels that can be programmed to a flash memory cell (i.e. in a one-bit-per-cell flash memory L=2, in a two-bit-per-cell flash memory L=4, in a four-bit-per-cell flash memory L=16). Then, $s_i$ is programmed to the i'th cell. Furthermore, let us denote the read voltages of the set of M cells by the vector v=[$v_1$ $v_2$ ... $v_M$]. Note that because cell reading is quantized in practical flash memory devices, $v_i$ can take only a finite set of K values {$V_1, V_2, \ldots, V_K$} where K is a function of the reading resolution and higher resolution corresponds to higher K.

We define that a cell's read voltage is v if the actual cell threshold voltage $v_{th}$ satisfies: LTH(v)≦$v_{th}$≦UTH(v), where LTH and UTH are a functions that match lower and upper reading thresholds for each of the K possible reading voltages {$V_1, V_2, \ldots, V_K$}. This means that the cell's transistor is open ('1') when threshold voltage UTH(v) is loaded on the cell's transistor control gate while the cell's transistor is closed ('0') when LTH(v) is loaded on the cell's transistor control gate.

Denote the CVD of a cell as the probability density function $f(v)$ providing the probability of reading the cell at each possible voltage v. Note that the CVD "of a cell" actually is the CVD of a population of cells to which the cell belong. The typical example of such a population is a population of cells whose threshold voltages are disturbed similarly by neighboring cells. Usually, we have a statistical model for the CVD of the cell with parameters θ. For example we can model the CVD of a cell by a Gaussian Mixture Model (GMM), such that the probability of a cell to be programmed to state $S_j$ (j∈{1, ..., L}) is $\lambda_j$ and the voltage distribution of the cell given that it was programmed to state $s_j$ is normally distributed with expectation $\mu_j$ and standard deviation $\sigma_j$:

$$f(v \mid \underline{\theta}) = \sum_{j=1}^{L} \lambda_j \int_{LTH(v)}^{UTH(v)} \frac{1}{\sqrt{2\pi\sigma_j^2}} e^{-\frac{(v'-\mu_j)^2}{2\sigma_j^2}} dv', \quad (1)$$

where $\underline{\theta} = [\lambda_1 \ldots \lambda_L \mu_1 \ldots \mu_L \sigma_1 \ldots \sigma_L]$ Preferably, a scrambling mechanism is used in order to randomize the stored bits prior to programming, as described in US Patent Application Publications Nos. 2008/0151618 and 2008/0215798. In that case we can assume that all programmed states are equally probable, i.e. ∀j∈{1, ..., L} $\lambda_j$=1/L and $$f(v \mid \underline{\theta}) = \frac{1}{L}\sum_{j=1}^{L} \int_{LTH(v)}^{UTH(v)} \frac{1}{\sqrt{2\pi\sigma_j^2}} e^{-\frac{(v'-\mu_j)^2}{2\sigma_j^2}} dv', \quad (2)$$

where $\underline{\theta} = [\mu_1 \ldots \mu_L \sigma_1 \ldots \sigma_L]$

The CVD parameters θ of the cell can be functions of the charge stored in the neighboring cells, which is manifested in the read voltages of the neighboring cells. So, in general the CVD of the i'th cell, is given by $f(v|\underline{\theta}_i)$ where are $\underline{\theta}_i$ are the CVD parameters of the i'th cell which are a function of the read voltages of the neighboring cells of the i'th cell.

We estimate the CVD parameters θ=[$\theta_1$ $\theta_2$ ... $\theta_M$] of each cell from the set of M read cells as a function of the vector of read voltages v=[$v_1$ $v_2$ ... $v_M$] and under the assumption that the underlying bit sequence stored in the M cells is composed of a set of valid codewords (i.e. composed of bit sequences c∈C). Based on these CVD parameters we can get optimal estimates for the stored bits through a process of ECC decoding.

Obtaining a closed form expression for the CVD parameters under the assumption that the stored bits belong to valid codewords is usually not feasible. Therefore, we use an iterative method for jointly estimating the CVD parameters and the stored bits.

The idea is to iterate between a block that computes the CVD parameters and a block that performs ECC decoding until convergence to a valid set of codewords is obtained. The incentive for this approach is that CVD parameters estimation is more accurate and less complex if we know the stored bits (or programmed states) and on the other hand ECC decoding of the stored bits is more likely to succeed and more likely to require less operations if accurate CVD parameters are available. By iteratively exchanging information between the CVD parameters estimation block and the ECC decoding block we increase the probability of overall success in recovering the stored bits and we can simplify each of the blocks and shorten the overall convergence time of the scheme to the correct solution.

Referring now to the drawings, FIG. 1 is a schematic diagram of this iteration between CVD parameter computation and ECC decoding.

In FIG. 1 we use the following notation:

1) v=[$v_1$ $v_2$ ... $v_M$] is the vector of voltages read from the M cells.

2) $\hat{\underline{\theta}}=[\hat{\underline{\theta}}_1 \hat{\underline{\theta}} \ldots \hat{\underline{\theta}}_M]$ is the estimate of θ (the CVD parameters of each cell).

3) $\underline{L}_a=[\underline{L}_{a1} \underline{L}_{a2} \ldots \underline{L}_{aM}]$ is a vector of a-priori soft estimates of the states s=[$s_1$ $s_2$ ... $s_M$] programmed to the M cells. Such soft estimates can be expressed in various ways. One common way is to provide the probabilities for each possible cell state S={$S_1, S_2, \ldots, S_L$} given that the cell's read voltage is v, i.e. $\underline{L}_{ai}$=[Pr($v_i|s_i=S_1,\hat{\theta}_i$) ... Pr($v_i|s_i=S_L,\hat{\theta}_i$)]. Another common way is to use Log-Likelihood Ratio's (LLRs). In this case $\underline{L}_{ai}$ is given by:

$$L_{ai} = \left[\log\frac{Pr(v_i \mid s_i = S_1, \hat{\theta}_i)}{Pr(v_i \mid s_i \neq S_1, \hat{\theta}_i)} \ldots \log\frac{Pr(v_i \mid s_i = S_L, \hat{\theta}_i)}{Pr(v_i \mid s_i \neq S_L, \hat{\theta}_i)}\right]' \quad (3)$$

Without loss of generality we assume in the following that LLR soft estimates are used.

$\underline{L}_d = [\underline{L}_{d1}\ \underline{L}_{d2}\ \ldots\ \underline{L}_{dM}]$ is a vector of a-posteriori soft estimates (after BCC decoding) of the states $s = [s_1\ s_2\ \ldots\ s_M]$ programmed to the M cells. Assuming LLR soft estimates, $\underline{L}_{di}$ is given by:

$$L_{di} = \left[\log \frac{Pr(\underline{v}, \underline{c} \in C \mid s_i = S_1, \hat{\underline{\theta}})}{Pr(\underline{v}, \underline{c} \in C \mid s_i \neq S_1, \hat{\underline{\theta}})} \ \ldots\ \log \frac{Pr(\underline{v}, \underline{c} \in C \mid s_i = S_L, \hat{\underline{\theta}})}{Pr(\underline{v}, \underline{c} \in C \mid s_i \neq S_L, \hat{\underline{\theta}})}\right]' \quad (4A)$$

where $c \in C$ indicates that the bit sequences stored in the M cells correspond to valid codewords.

5) $\underline{L}_e[\underline{L}_{e1}\ \underline{L}_{e2}\ \ldots\ \underline{L}_{eM}]$ is a vector of extrinsic soft estimates of the states $\overline{s} = [s_1\ s_2\ \ldots\ s_M]$ programmed to the M cells. An extrinsic estimate of a cell's state is an estimate which is not based on the read cell voltage and its estimated CVD parameters. Assuming LLR soft estimates, $\underline{L}_{ei}$ is given by $$L_{ei} = \qquad (5)$$
$$\left[\log \frac{Pr(\underline{v}_{[i]}, \underline{c} \in C \mid s_i = S_1, \hat{\underline{\theta}}_{[i]})}{Pr(\underline{v}_{[i]}, \underline{c} \in C \mid s_i \neq S_1, \hat{\underline{\theta}}_{[i]})} \ \ldots\ \log \frac{Pr(\underline{v}_{[i]}, \underline{c} \in C \mid s_i = S_L, \hat{\underline{\theta}}_{[i]})}{Pr(\underline{v}_{[i]}, \underline{c} \in C \mid s_i \neq S_L, \hat{\underline{\theta}}_{[i]})}\right]'$$

where $\underline{v}_{[i]}$ is the vector $\underline{v}$ excluding $v_i$ and is the vector $\underline{\theta}$ excluding $\theta_i$. Using extrinsic soft estimates in iterative schemes is well known. Using extrinsic soft estimates improves the performance of the scheme by preventing a situation of "self conviction". In other words, we want to avoid a situation that the CVD parameters estimation block estimates the CVD parameters of the i'th cell $\theta_i$ based on its own previous estimation.

6) is the $\hat{c}_1, \hat{c}_2, \ldots$ ECC decoder output, where $\hat{c}_j$ the estimate for the j'th codeword stored in the M cells.

The following blocks appear in FIG. 1:

1) CVD Parameters Estimation Block

This block estimates the CVD parameters for each cell based on the read cell voltages and based on estimates of the cells' programmed states. In general, CVD parameters of a cell, given that it was programmed to state s and given that its neighbors read voltages are $v_n$, can be computed by examining the statistics of all the cells that were programmed to state s whose neighbors' read voltages are $v_n$. In simple cases the cell's neighbors' read voltages do not affect the CVD of the cell—this is usually the case if cross coupling effects between a cell and its neighbors are mitigated by using a multi-step programming plan as taught e.g. in U.S. Pat. No. 6,781,877. In this case we need to estimate a single set of CVD parameters for all cells. In any case, one can see that computation of the CVD parameters can be simplified if an estimation of the programmed cells' states is available.

According to one exemplary embodiment, hard decisions on the cells' states are used: for the i'th cell we estimate the programmed state $\hat{s}_i$ as the state which is most probable according to $\underline{L}_{ei}$, i.e.

$$\hat{s}_i = \operatorname*{argmax}_{S} L_{ei}.$$

Based on the programmed state estimates $\hat{s} = [\hat{s}_1\ \ldots\ \hat{s}_M]$, CVD parameters can be estimated more easily, because we can differentiate between the cell voltage distributions of different states.

Consider as an example the GMM model, described in (2). Let $\underline{\theta}_i = [\mu_{i,1}\ \ldots\ \mu_{i,L}\ \sigma_{i,1}\ \ldots\ \sigma_{i,L}]$ denote the unknown CVD parameters of the i'th cell, where $\mu_{i,j}$ and $\sigma_{i,j}$ are the expectation and standard deviation of the voltage distribution of j'th state of the i'th cell, respectively. Furthermore, let $v_{n(i)}$ denote the read voltages of the neighbors of the i'th cell—for example the 3 physically closest neighboring cells which have the strongest cross coupling and/or the strongest program disturb with the i'th cell can be considered. In this case $v_{n(i)} = [v_{n(i),1}\ v_{n(i),2}\ v_{n(i),3}]$. Finally, let $M(j) = \{i' \mid \hat{s}_{i'} = S_j\}$, $\forall j \in \{1, \ldots, L\}$ be the set of cells among the M cells for which we estimated the programmed state j and denote by $|M(j)|$ its cardinality $$\left(\text{i.e.} \sum_{j=1}^{L} |M(j)| = M\right).$$

Then we can estimate the CVD parameters of the i'th cell, using Linear Minimal Mean Square Error (LMMSE) estimation, as follows:

$$\hat{\mu}_{i,j} = \hat{\mu}_j + \hat{C}_{j,n} \cdot \hat{C}_n^{-1} \cdot (\underline{v}_{n(i)} - \hat{\underline{\mu}}) \qquad (6)$$
$$\hat{\sigma}_{i,j} = \hat{\sigma}_j - \hat{C}_{j,n} \cdot \hat{C}_n^{-1} \cdot \hat{C}_{j,n}^*$$
where
$$\hat{\mu}_j = \frac{1}{|M(j)|} \sum_{i' \in M(j)} v_{i'}, \qquad (7)$$
$$\hat{\underline{\mu}} = \frac{1}{L} \sum_{j=1}^{L} \hat{\mu}_j,$$
$$\hat{\sigma}_j = \frac{1}{|M(j)| - 1} \sum_{i' \in M(j)} (v_{i'} - \hat{\mu}_j)^2,$$
$$\hat{C}_{j,n} = \frac{1}{|M(j)| - 1} \sum_{i' \in M(j)} (v_{i'} - \hat{\mu}_j)(\underline{v}_{n(i')} - \hat{\underline{\mu}}),$$
$$\hat{C}_n = \frac{1}{|M(j)| - 1} \sum_{i' \in M(j)} (\underline{v}_{n(i')} - \hat{\underline{\mu}})' \cdot (\underline{v}_{n(i')} - \hat{\underline{\mu}})$$

In case cross coupling effects and program disturb effects between neighboring cells are mitigated during programming, the CVD parameters are the same for all cells and estimation is simplified as follows:

$$\hat{\mu}_{i,j} = \hat{\mu}_j, \hat{\sigma}_{i,j} = \hat{\sigma}_j \qquad (8)$$

Note that other estimation algorithms can be applied in order to estimate the CVD parameters. For example, a more optimal MAP estimation can be used instead of the LMMSE estimation. In this case, the state estimates (derived from $\underline{L}_e$) are used in order to divide the cells into subsets of cells characterized by having the same state and the same neighboring cell states. Then the CVD parameters of each such cell population can be estimated very simply, for example by computing an empirical expectation value and variance of each population.

In the examples above, the extrinsic estimates were used in order to produce "hard" decisions on the states. A more complex and accurate scheme can utilize the soft state estimates. For example, the CVVD parameters based on soft values of the $\underline{L}_{ei}$ may be estimated based on only some of the cells, for example only on the more reliable cells. This results in simpler processing (less information is processed) and more accurate results. We can choose the cells that will be used for the CVD parameters estimation as the cells whose extrinsic state estimation is more reliable (i.e. the cells for which max $|L_{ei}|$ is higher). One optimal scheme uses the soft state estimation as part of the CVD parameters estimation (without performing hard decisions) based on Bayesian estimation techniques (S. M. Kay, Fundamentals of Statistical Signal Processing: Estimation Theory, Prentice-Hall Inc., 1993—chapters 10-12). Baysean estimation techniques allow utilization of a-priori statistics of the estimated parameters (in the present case, a-priori probabilities for the cell to be programmed to each state).

Additional details on how to compute CVD parameters, given an estimate of the read cell voltages and the programmed cell states, can be found in U.S. Ser. No. 11/941,945 and in U.S. Ser. No. 11/860,553.

2) Soft States Estimation Block

This block computes a-priori soft estimates of the programmed cells' states based on the read cell voltages and on the estimated cells' CVD parameters. For example in the GMM model described in (2), we can compute the soft state estimate $$Pr(v_i \mid s_i = S_j, \hat{\theta}_i) = \int_{LTH(v_i)}^{UTH(v_i)} \frac{1}{\sqrt{2\pi\hat{\sigma}_{i,j}^2}} e^{-\frac{(v'-\hat{\mu}_{i,j})^2}{2\hat{\sigma}_{i,j}^2}} dv',$$ (9)

$$Pr(v_i \mid s_i \neq S_j, \hat{\theta}_i) = 1 - Pr(v_i \mid s_i = S_j, \hat{\theta}_i)$$

The terms in (9) can then be substituted in (3) in order to compute the a-priori soft estimates $\underline{L}_{ai}$.

3) ECC Decoding Block

This block computes the a-posteriori soft estimates $\underline{L}_{di}$ based on the a-priori state estimates $\underline{L}_{ai}$ and based on the assumption that the stored bits constitute valid codewords. In practice iterative ECC schemes can be used for this. In such a scheme an iterative decoder can approximately compute $\underline{L}_d$ based on $\underline{L}_a$. Such a code can operate directly on the cell states. However, due to complexity considerations it is more common to use a suboptimal decoder that operates on soft bit estimates (as opposed to soft state estimates). Let $b_{i,j}$ denote the j'th bit stored in the i'th cell. Then such a decoder can operate on a-priori soft bit LLR estimates defined as $$L_{a_{i,j}} = \log \frac{Pr(v_i \mid b_{i,j} = 0, \hat{\theta}_i)}{Pr(v_i \mid b_{i,j} = 1, \hat{\theta}_i)}$$

to produce a-posteriori soft bit LLR estimates defined as $$L_{d_{i,j}} = \log \frac{Pr(v_i \mid b_{i,j} = 0, \hat{\theta}_i, \underline{c} \in C)}{Pr(v_i \mid b_{i,j} = 1, \hat{\theta}_i, \underline{c} \in C)}.$$

The a-priori soft bit estimates can be computed as follows:

$$L_{a_{i,j}} = \log \frac{Pr(v_i \mid b_{i,j} = 0, \hat{\theta}_i)}{Pr(v_i \mid b_{i,j} \neq 1, \hat{\theta}_i)} = \log \frac{\sum_{S_j = 0} Pr(v_i \mid s_i = S, \hat{\theta}_i)}{\sum_{S_j = 1} Pr(v_i \mid s_i = S, \hat{\theta}_i)}$$

The a-posteriori soft bit estimates can be translated into approximate a-posteriori state estimates by ignoring the statistical dependencies between these bit estimates (originating from the fact that the bits belong to the same cell and were subjected to the same noises). This can be done simply by estimating the state $\hat{S}_i$ of cell 'i' by taking the hard decisions of the extrinsic bit estimates, for the bits stored in the i'th cell, and mapping the hard decisions to a state based on the mapping used during programming. Alternatively, approximate soft state estimates can be computed. For example, in the four-bits-per-cell case, the a-posteriori soft state estimate of the i'th cell can be approximated as follows:

$$Pr(s_i = b_0 b_1 b_2 b_3 \mid \underline{v}, \hat{\theta}, \underline{c} \in C) \cong \prod_{j=0}^{3} Pt(b_{i,j} = b_j \mid \underline{v}, \hat{\theta}, \underline{c} \in C),$$

where $b_{j=0,1,2,3} \in \{0, 1\}$

Note that using an ECC decoder that operates on the bits stored in the cells instead of the states programmed to the cells is sub-optimal, because information regarding the statistical dependencies between bits stored in the same cell is lost. An optimal scheme would use a decoder that operates directly on the programmed states. Such a decoder is described in Y. Nana, E. Sharon and S. Litsyn, "Improved decoding of LDPC codes for multilevel modulations," IEEE Communication Letters, vol. 10, pp. 375-377, May, 2006.

Figure 2:
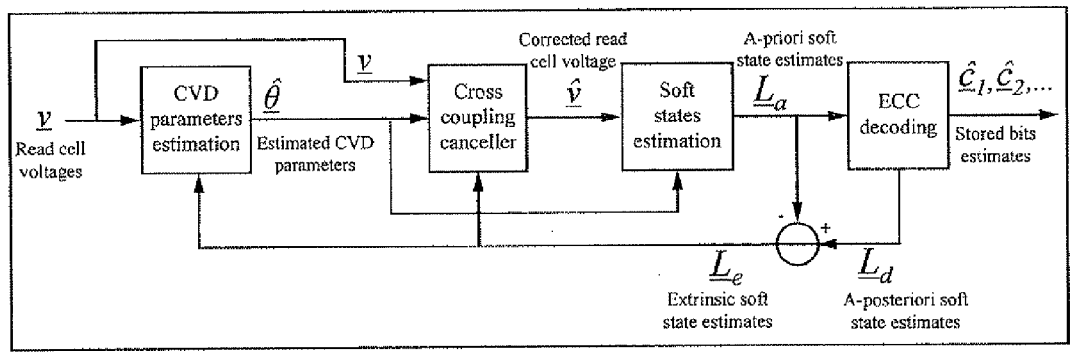
FIG. 2 is a schematic diagram of iteration between CVD parameter computations and ECC decoding with separate cancellation of cross-coupling.

An alternative exemplary scheme is shown in FIG. 2. According to this scheme, we first generate corrected estimates of the cells read voltages $\hat{v}$ by canceling the cross coupling effects and the PD effects of neighboring cells and then estimate each cell's state based on CVD parameters which are fixed for all cells. The scheme shown in FIG. 2, includes the following three blocks that replace the CVD parameters estimation block and the soft states estimation block shown in FIG. 1:

1) CVD Parameters Estimation Block

This block estimates fixed CVD parameters for all cells (instead of different parameters for each cell as in FIG. 1). Hence, this block has lower complexity compared to the equivalent block in FIG. 1. For example, under the GMM CVD model described by (2) and assuming an LMMSE cross coupling and program disturb canceller, the estimated parameters are:

$\hat{\theta} = [\hat{\theta}_1 \ldots \hat{\theta}_L]$, where $\hat{\theta}_j = [\hat{\mu}_j \tilde{\sigma}_j \underline{\alpha}_j]$ and $\tilde{\sigma}_j = \hat{\sigma}_j - \underline{\alpha}_j \cdot \hat{C}^*_{j,n}$, $\underline{\alpha}_j = \hat{C}_{j,n} \cdot \hat{C}_n^{-1}$ and $\hat{\mu}_j, \hat{\sigma}_j, \hat{C}_{j,n}, \hat{C}_n$ are defined in (7)

Hence, the number of estimated parameters in this example is proportional to the number of states L instead of the number of cells M.

2) Cross Coupling Canceller Block

This block computes a corrected value of the i'th cell's voltage by cancelling the cross coupling effects and the PD effects of its neighboring cells. Under the GMM CVD model described by (2) and assuming an LMMSE cross coupling and program disturb canceller, this is performed as follows:

Based on the estimated state of the i'th cell $\hat{s}_i = S_j$ the cross coupling and program disturb canceller block chooses the correct coefficients $\underline{\alpha}_j$ and performs the following computation:

$$\hat{v}_i = v_i - \underline{\alpha}_j \cdot (\underline{v}_{n(i)} - \hat{\mu})$$ (10)

Note that various variants of the cross coupling and program disturb canceller block can be implemented. In some cases cancelling the effect of neighboring cells on the target cell can be improved by knowing the programmed state of the neighboring cells and not only the read voltages of the neighboring cells. Two examples of this are:

A. Mitigation of PD noises by identifying cells that are more prone to PD and adapting the computation of their corrected voltage v̂ accordingly (for example applying stronger correction to their read voltage). PD noise of a cell is usually a function of the programmed states of its neighboring cells, where certain patterns result in higher probability for strong PD. Hence, identifying cells which are more prone to PD requires knowing the programmed state of their neighboring cells. Thus, To by utilizing the extrinsic estimates of the cells' states we can identify cells that are more prone to PD and improve the estimation of v̂.

B. Cancellation of cross coupling effects in all-bit-line (ABL)-type Flash devices. In this type of device all bit lines in a word line are programmed simultaneously (as opposed to conventional Flash devices in which odd and even bit lines are programmed separately). As a result the cross coupling effect of a cell on its neighboring cell in the same word line is less predictable based on its read voltage. The cross coupling effect is a function of the amount of change in the charge of the "disturbing" cell that occurred after the target cell was inhibited (finished its programming). Hence in an ABL device in which all the cells in a word line are programmed simultaneously we need to predict the amount of charge change of a neighboring cell after the target cell was inhibited in order to provide better cross coupling cancellation. Such prediction can be improved if we know the programmed state of the neighbor and target cells. For example if we know that the neighbor cell was programmed to a lower state and the target cell was programmed to a higher state then the probability that the neighbor cell affected the target cell is low because most likely the neighbor cell was inhibited before the target cell. On the other hand, if we know that the neighbor cell was programmed to a higher state and the target cell was programmed to a lower state then the probability that the neighbor cell affected the target cell is high since most likely the neighbor cell was inhibited after the target cell. This knowledge can be employed in order to improve the cross coupling cancellation (i.e. the estimation of v̂), by taking into account also the relation between the programmed states of a target cell and its neighbors. In this case (10) looks like:

$$\hat{v}_i = v_i - \underline{\alpha}_j \cdot \left[ \left( v_{n(i)} - v_i \right) - \hat{\mu}_{\Delta n(i)}^j \right], \hat{\mu}_{\Delta n(i)}^j = E_{v_{-n(i)} \geq \hat{u}_j} \left\{ \left( v_{n(i)} - \hat{u}_j \right) \right\} \quad (11)$$

Note that in (11) the term $\hat{\mu}_{\Delta n(i)}^j$ is a function of the state $S_1$ that cell i was programmed to, meaning that $\hat{\mu}_{\Delta n(i)}^j$ is the average charge (voltage) that neighboring cells, in the same word-line, accumulate after the target cell i (for which voltage $v_i$ was read from) was inhibited. As j increases so the cross coupling effect decreases. When j=L, i.e. the highest state, is considered as the target cell, no other states are likely to be programmed after it, and hence cells in $S_L$ suffer the least from the cross coupling effect from neighboring cells in the same word line. The target cells can still suffer from neighboring cells in adjacent word-lines that are entirely programmed after the word line which cell i belongs to has finalized it's programming sequence. More details on digital cross coupling cancellation can be found in U.S. Ser. No. 11/860,553.

3) Soft States Estimation Block

This block is similar to the corresponding block in FIG. 1, except that CVD parameters are fixed for all cells while the corrected cell's voltages v̂ are employed for the computation of the a-priori soft states estimation. Hence, in the GMM model described in (2), we can compute the a-priori soft state estimate for each cell as follows:

$$Pr(\hat{v}_i \mid s_i = S_j, \hat{\underline{\theta}}) = \int_{Lth(\hat{v}_i)}^{UTH(\hat{v}_i)} \frac{1}{\sqrt{2\pi\hat{\sigma}_j^2}} e^{-\frac{(v'-\hat{\mu}_j)^2}{2\hat{\sigma}_j^2}} dv', \quad (12)$$

$$Pr(\hat{v}_i \mid s_i \neq S_j, \hat{\underline{\theta}}) = 1 - Pr(\hat{v}_i \mid s_i = S_j, \hat{\underline{\theta}})$$

The terms in (12) can then be substituted in (3) in order to compute the a-priori soft state estimates $L_{ai}$.

Figure 3:
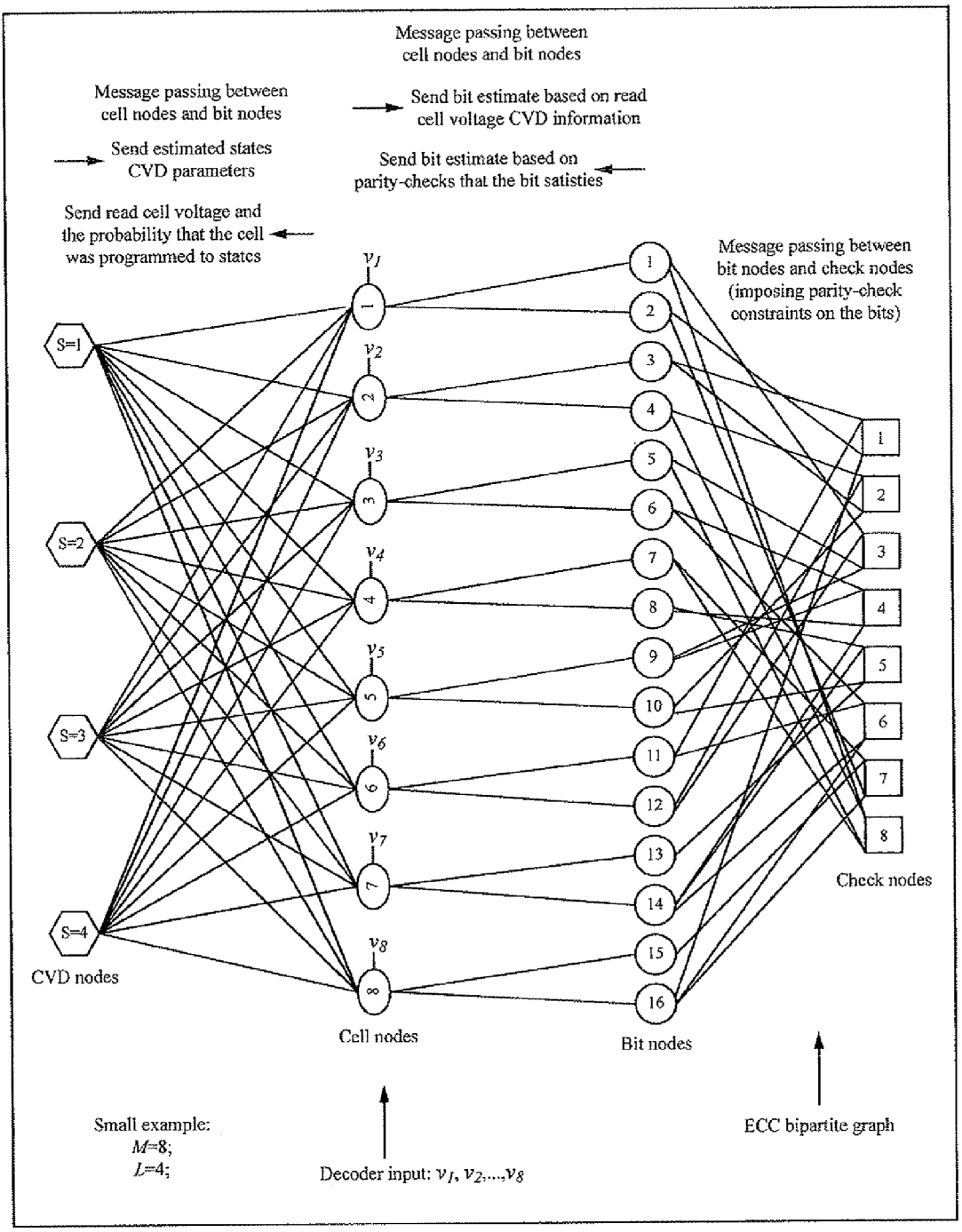
FIG. 3 is a factor graph that is equivalent to FIG. 1.

The iterative schemes described above can also be described in the context of factor graphs and message passing decoding (Kschischang, F. R.; Frey, B. J.; Loeliger, H. A., Factor graphs and the sum-product algorithm, *IEEE Transactions on Information Theory*, vol. 47, pp. 498-519, February 2001). This is an equivalent description that is commonly used for iterative schemes. In this setting, the various unknown parameters which require estimation (such as CVD parameters, programmed cell states and stored bits) and the various constraints on the parameters (such as the constraints posed by the physics of the cell and the constraints posed by the ECC code) appear as nodes in a factor graph while edges are connected between parameters and their constraints. An iterative message passing algorithm is used in order to find the unknown parameters by exchanging information between the parameters and their constraints along the graph edges. These messages carry estimates of the parameters that are updated iteratively. The algorithm is iterated until convergence of the parameters to values that satisfy all constraints, or until some maximal number of iterations is reached. FIG. 3 shows a factor graph that is equivalent to the scheme illustrated in FIG. 1.

Figure 4:
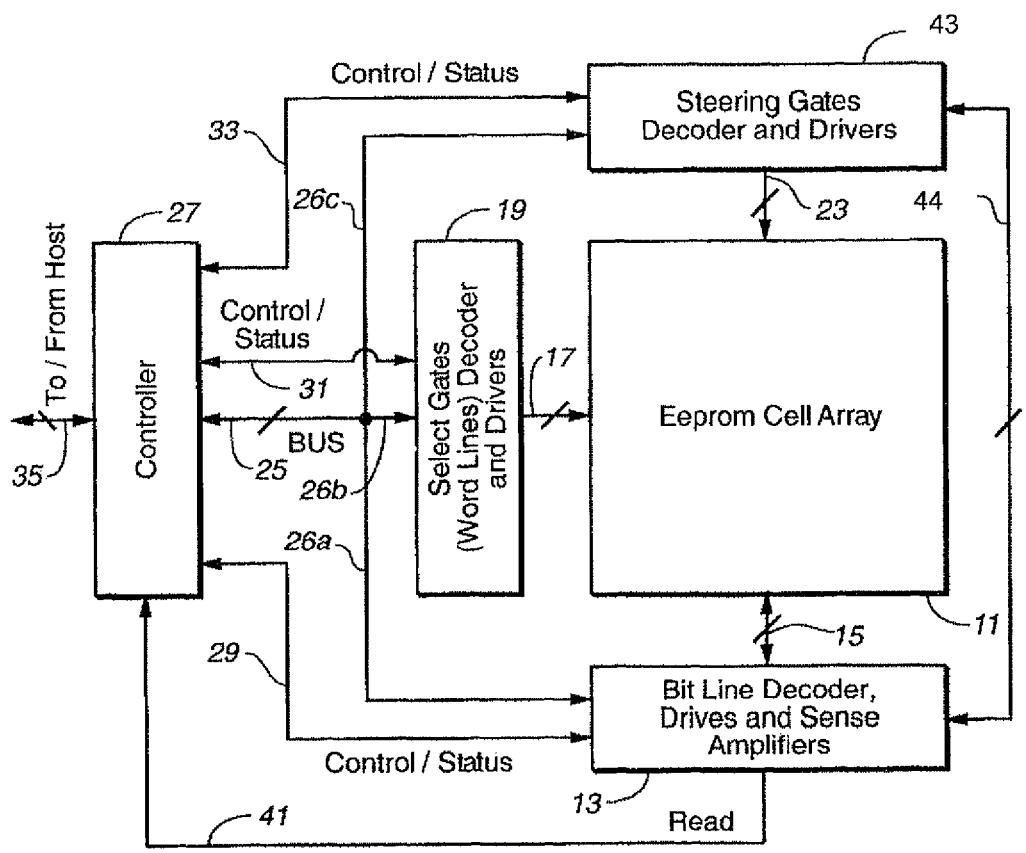
FIG. 4 is a high-level schematic block diagram of a flash memory device.

FIG. 4 is a high-level schematic block diagram of a flash memory device. A large number of individually addressable memory cells are arranged in a regular array 11 of rows and columns. Individual memory cells can be controlled by bit lines, select gates arranged in word lines, and steering gates. Bit lines are designated herein to extend along columns of array 11, and word lines are designated to extend along the rows of array 11. Bit line unit 13 may include a bit line decoder, storage elements, driver circuits and sense amplifiers. Bit line unit 13 can be coupled to cell array 11 by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 43 may include a steering gate decoder and driver circuits. Steering unit 43 can be coupled to cell array 11 by line 23, to controller 27 by steering-control line 33, and to bit line unit 13 by line 44. Bit line unit 13, word line unit 19 and steering unit 43 can be coupled to bus 25, which in turn is coupled to controller 27. Controller 27 can be coupled to the host by line 35.

When a preselected memory cell is to be programmed, voltages can be applied to the bit lines, word line and steering gates, corresponding to the preselected memory cell, at predetermined levels sufficient for the programming of the preselected cell. Controller 27 sends the address of the preselected memory cell through bus 25 to the respective decoders in bit line unit 13, word line unit 19, and steering gate unit 43 through lines 26a, 26b, and 26c, respectively. Status and control commands between bit line unit 13, word line unit 19, steering gate unit 43 and controller 27 are communicated through bit-control line 29, word-control line 31 and steering control line 33.

When a preselected memory cell is to be read, voltages can be applied to the corresponding bit lines, word line and steering gates, corresponding to the preselected memory cell, at predetermined levels, sufficient to enable the reading of the preselected memory cell. Controller 27 is capable of applying the voltages of the bit lines through bit-control line 29, applying the voltages of the word lines through word-control line 31 and applying the voltages of steering gates through steering control line 33. A current can be generated through the preselected memory cell by these voltages. The current is indicative of whether the preselected memory cell was programmed or not (in the case of the cells of array 11 having been programmed one bit per cell) or of the bit pattern that has been stored in the preselected memory cell (in the case of the cells of array 11 having been programmed with more than one bit per cell). The value of the current can be amplified and compared against references by sense amplifiers in bit line unit 13, the result of which can be temporarily stored in latches or registers. The resultant data, read out from the preselected memory cell, can be sent to controller 27 through read line 41.

In reading the cells of array 11, controller 27 performs joint CVD estimation and error correction as described above. The functional blocks of controller 27 that perform the joint CVD estimation and error correction, as illustrated in FIG. 1 or alternatively as illustrated in FIG. 2, may be implemented in hardware, in firmware, in software, or as a combination of hardware and/or firmware and/or software.

Figure 5:
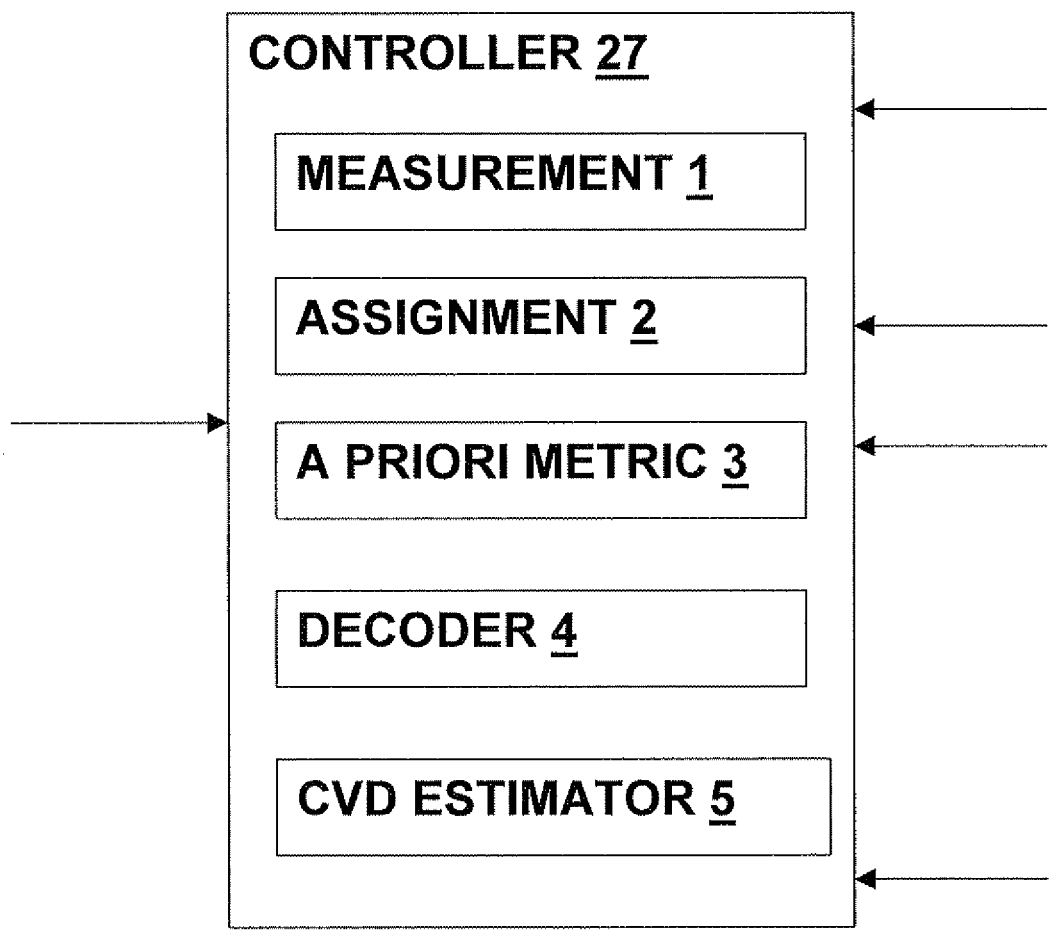
FIGS. 5 and 6 show two embodiments of the controller of FIG. 4.

FIG. 5 shows one embodiment of controller 27. This embodiment of controller 27 includes five functional blocks: a measurement functional block 1, an assignment functional block 2, an a-priori metric functional block 3, a decoder 4 and a CVD model estimation block 5. Measurement functional block 1 applies the relevant voltages through bit-control line 29, word-control line 31 and steering control line 33 to obtain, via read line 41, threshold voltage values of the cells of array 11. Assignment functional block 2 assigns each cell to its CVD model population. A-priori metric functional block 3 corresponds to the soft states estimation block of FIG. 1. Decoder 4 corresponds to the ECC decoding block of FIG. 1. CVD model estimation block 5 corresponds to the CVD parameters estimation block of FIG. 1. In an alternative embodiment, all the cells are deemed to belong to the same CVD model population, and assignment functional block 2 either is inactivated or is absent.

Figure 6:
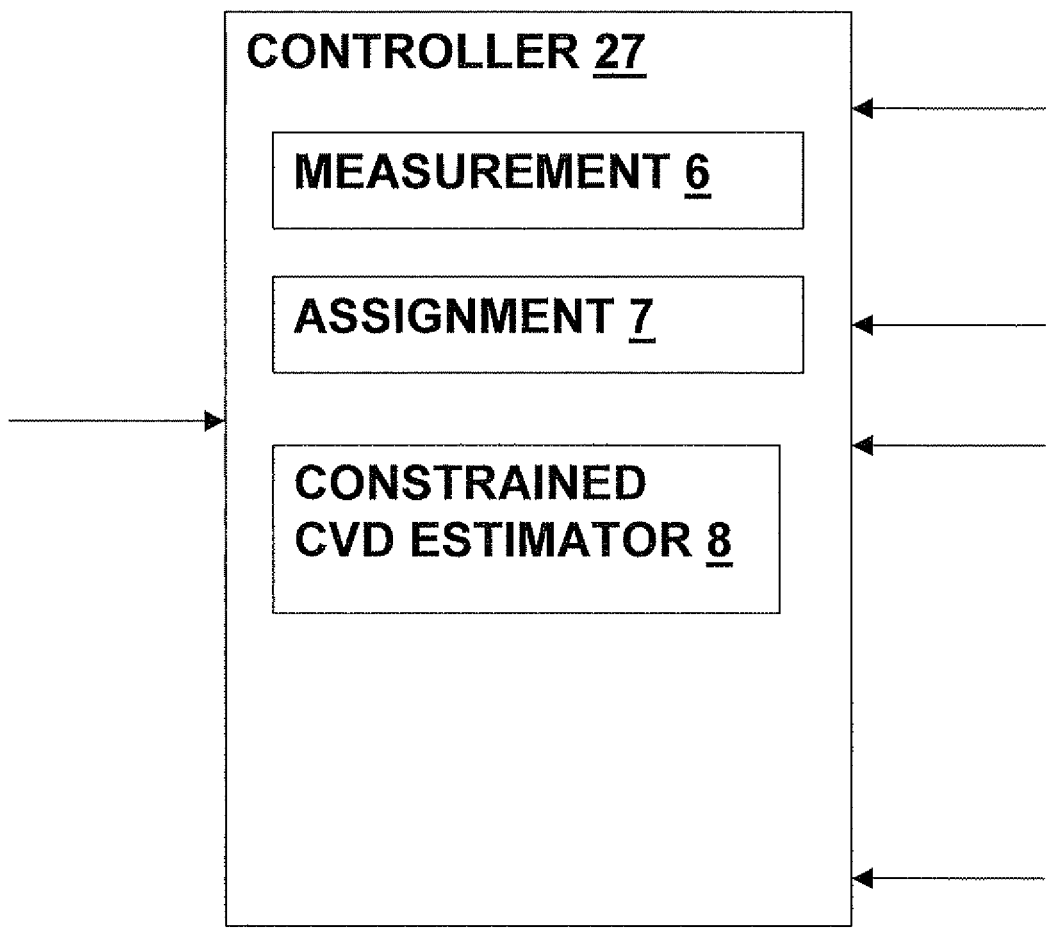

FIG. 6 shows another embodiment of controller 27. This embodiment of controller 27 includes three functional blocks: a measurement functional block 6, an assignment functional block 7, and a constrained CVD model estimation block 8. Measurement functional block 6 applies the relevant voltages through bit-control line 29, word-control line 31 and steering control line 33 to obtain, via read line 41, threshold voltage values of the cells of array 11. These threshold voltages are indicative of the bit patterns stored in the cells. Assignment functional block 7 assigns each cell to its CVD model population. Constrained CVD model estimation block 8, that corresponds to the functional blocks illustrated in FIG. 1, estimates the CVD models under the constraint that the bit patterns collectively must be a valid error correction codeword. In an alternative embodiment, all the cells are deemed to belong to the same CVD model population, and assignment functional block 7 either is inactivated or is absent.

Figure 7:
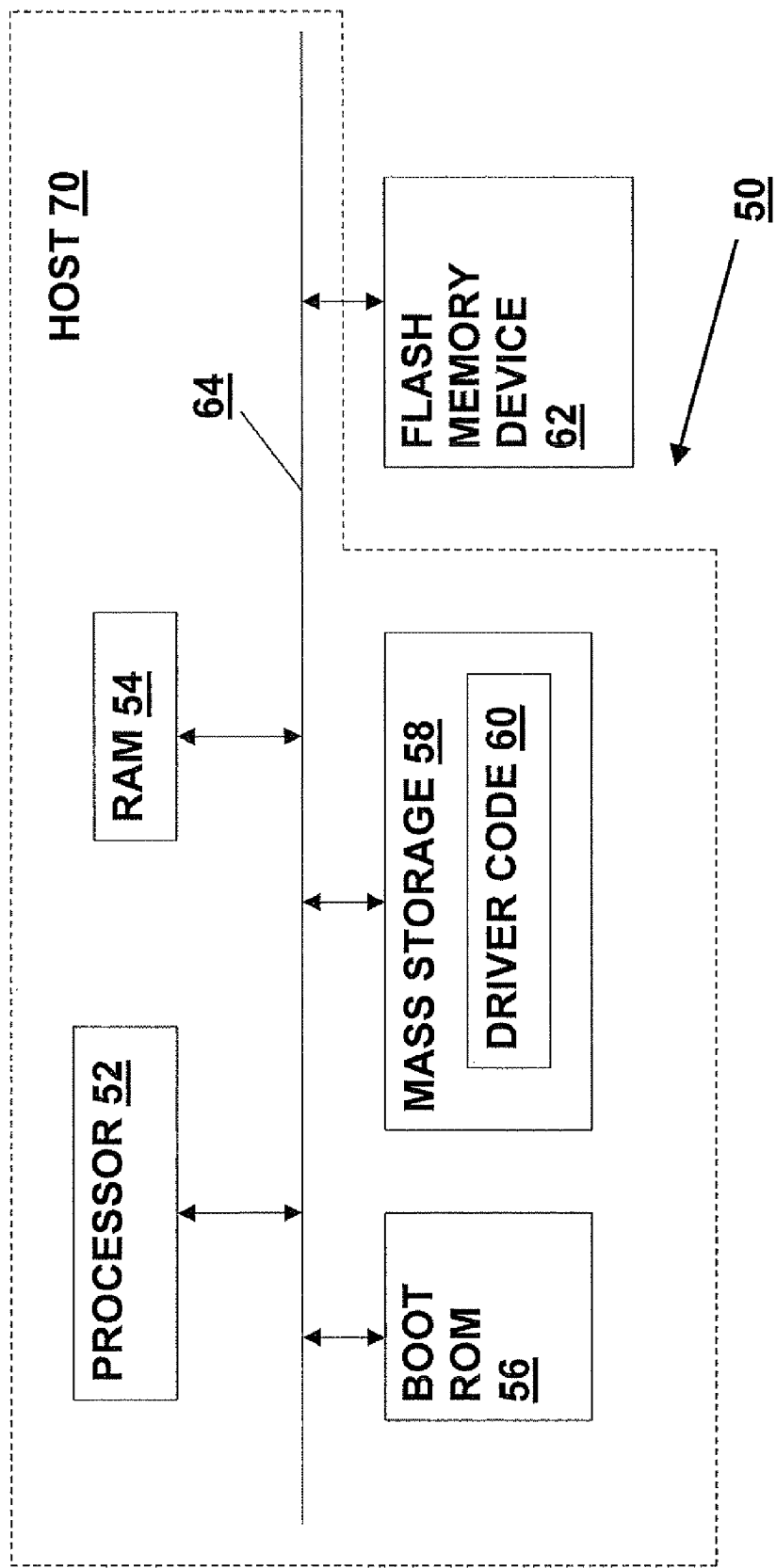
FIG. 7 is a high-level schematic block diagram of a system for managing a flash memory device.

FIG. 7 is a high-level block diagram of a system 50 of the present invention. System 50 includes a processor 52 and four memory devices: a RAM 54, a boot ROM 56, a mass storage device (hard disk) 58 and a flash memory device of FIG. 4 as a flash memory device 62, all communicating via a common bus 64. In system 50, controller 27 of flash memory device 62 functions only as an interface to bus 64; the rest of the functionality of flash controller 27 of FIG. 2B as described above is emulated by flash memory driver code 60 that is stored in mass storage device 58 and that is executed by processor 52 to interface between user applications executed by processor 52 and flash memory device 62, and to manage the flash memory of flash memory device 62. In addition to the conventional functionality of such flash management driver code, driver code 60 emulates the functionality of controller 27 of FIG. 4 with respect to joint CVD estimation and error correction as described above. Driver code 60 typically is included in operating system code for system 50 but also could be freestanding code.

The components of system 50 other than flash memory device 62 constitute a host 70 of flash memory device 62. Mass storage device 58 is an example of a computer-readable storage medium bearing computer-readable driver code for joint CVD estimation and error correction. Other examples of such computer-readable To storage media include read-only memories such as CDs bearing such code.

A limited number of embodiments of methods for joint CVD estimation and error correction, and of a device and system that use the methods, have been described. It will be appreciated that many variations, modifications and other applications of the methods, device and system may be made.

What is claimed is:

1. A method of reading a plurality of memory cells, comprising:
    (a) assigning each cell to a respective one of a plurality of cell populations;
    (b) measuring a respective value of an operational parameter of each cell;
    (c) providing a value of at least one first respective cell distribution model parameter of each population;
    (d) assigning each cell a respective a priori metric, based at least in part on the respective at least one cell distribution model parameter value of the cell's respective population;
    (e) decoding the a priori metrics, thereby providing, for each cell, a respective a posteriori metric; and
    (f) based at least in part on the a posteriori metrics, and without repeating the measuring of the respective values of the operational parameters: estimating a value of at least one second respective cell distribution model parameter of each population.

2. The method of claim 1, wherein the operational parameters are threshold voltages of the cells.

3. The method of claim 1, wherein, for at least one population, the providing of the value of the at least one first respective cell distribution model parameter of that population is based at least in part on the measured values of the operational parameters of the cells of that population.

4. The method of claim 1, wherein, for each cell, the assigning of the a priori metric of that cell is based in part on the value of the operational parameter of that cell.

5. The method of claim 1, wherein a representation of an error correction codeword is stored in the cells, and wherein the estimating is contingent on the decoding failing to produce a valid error correction codeword.

6. The method of claim 1, wherein the decoding also provides, for each cell, a respective estimate of at least one bit that is stored in that cell.

7. The method of claim 1, wherein the a posteriori metrics are extrinsic a posteriori metrics.

8. The method of claim 1, wherein the metrics include log likelihood ratios.

9. The method of claim 1, wherein the metrics are cell state metrics.

10. The method of claim 1, wherein the metrics are bit metrics.

11. The method of claim 1, wherein the assigning of each cell to a respective population is at least in part according to estimated cross-coupling of the each cell with at least one neighbor of the each cell.

12. The method of claim 1, wherein the assigning of each cell to a respective population is at least in part according to estimated program disturb of the each cell by at least one neighbor of the each cell.

13. The method of claim 1, wherein the assigning of each cell to a respective population is at least in part according to a respective measured value of an operational parameter of at least one neighbor of the each cell.

14. The method of claim 1, wherein, for at least one population, the first and second cell distribution model parameters are identical.

15. The method of claim 1, wherein, for at least one population, the first and second cell distribution model parameters are different.

16. A memory device comprising:
(a) a plurality of cells;
(b) circuitry for measuring a respective value of an operational parameter of each cell; and
(c) a controller operative:
 (i) to instruct the circuitry to measure the values of the operational parameters,
 (ii) to assign each cell to a respective one of a plurality of cell populations,
 (iii) to provide a value of at least one first respective cell distribution model parameter of each population,
 (iv) to assign each cell a respective a priori metric, based at least in part on the respective at least one cell distribution model parameter value of the cell's respective population;
 (v) to decode the a priori metrics, thereby providing, for each cell, a respective a posteriori metric, and
 (vi) to estimate a value of at least one second respective cell distribution model parameter of each population, based at least in part on the a posteriori metrics and without repeating the instructing of the circuitry to measure the operational parameter values.

17. A memory controller, for a memory that includes a plurality of cells, the memory controller comprising:
(a) a measurement functional block for obtaining from the memory, for each cell, a measurement of a respective value of an operational parameter of the cell;
(b) an assignment functional block for assigning each cell to a respective one of a plurality of cell populations;
(c) an a priori metric functional block for assigning each cell a respective a priori metric;
(d) a decoder for decoding the a priori metrics, thereby providing, for each cell, a respective a posteriori metric; and
(e) a cell distribution model functional block for:
 (i) providing a value of at least one first respective cell distribution model parameter of each population, the a priori metric of each cell then being based at least in part on the respective at least one cell distribution model parameter value of the cell's respective population, and
 (ii) estimating a value of at least one second respective cell distribution model parameter of each population, based at least in part on the a posteriori metrics and without repeating the obtaining of the operational parameter value measurements from the memory.

18. A system for managing a first memory that includes a plurality of cells, the system comprising:
(a) a second memory for storing code for:
 (i) obtaining, from the first memory, for each cell, a measurement of a respective value of an operational parameter of the cell;
 (ii) assigning each cell to a respective one of a plurality of cell populations,
 (iii) providing a value of at least one first respective cell distribution model parameter of each population,
 (iv) assigning each cell a respective a priori metric, based at least in part on the respective at least one cell distribution model parameter value of the cell's respective population,
 (v) decoding the a priori metrics, thereby providing, for each cell, a respective a posteriori metric, and
 (vi) estimating a value of at least one second respective cell distribution model parameter of each population, based at least in part on the a posteriori metrics, and without repeating the obtaining of the operational parameter value measurements from the first memory; and
(b) a processor for executing the code.

19. A non-transitory computer readable storage medium having computer readable code embodied on the non-transitory computer readable storage medium, the computer readable code for managing a memory that includes a plurality of cells, the computer readable code comprising:
(a) program code for obtaining from the memory, for each cell, a measurement of a respective value of an operational parameter of the cell;
(b) program code for assigning each cell to a respective one of a plurality of cell populations;
(c) program code for assigning each cell a respective a priori metric;
(d) program code for decoding the a priori metrics, thereby providing, for each cell, a respective a posteriori metric; and
(e) program code for:
 (i) providing a value of at least one first respective cell distribution model parameter of each population, the a priori metric of each cell then being based at least in part on the respective at least one cell distribution model parameter value of the cell's respective population, and
 (ii) estimating a value of at least one second respective cell distribution model parameter of each population, based at least in part on the a posteriori metrics and without repeating the obtaining of the operational parameter value measurements from the memory.

20. A method of reading a plurality of memory cells, comprising:
(a) measuring a respective value of an operational parameter of each cell;
(b) providing a value of at least one first cell distribution model parameter of the plurality of memory cells;
(c) assigning each cell a respective a priori metric, based at least in part on the at least one first cell distribution model parameter value;
(d) decoding the a priori metrics, thereby providing, for each cell, a respective a posteriori metric; and (e) based at least in part on the a posteriori metrics, and without repeating the measuring of the respective values of the operational parameters: estimating a value of at least one second cell distribution model parameter of the plurality of memory cells.

21. The method of claim 20, wherein the operational parameters are threshold voltages of the cells.

22. The method of claim 20, wherein the providing of the value of the at least one first cell distribution model parameter is based at least in part on the measured values of the operational parameters.

23. The method of claim 20, wherein, for each cell, the assigning of the a priori metric of that cell is based in part on the value of the operational parameter of that cell.

24. The method of claim 20, wherein a representation of an error correction codeword is stored in the cells, and wherein the estimating is contingent on the decoding failing to produce a valid error correction codeword.

25. The method of claim 20, wherein the decoding also provides, for each cell, a respective estimate of at least one bit that is stored in that cell.

26. The method of claim 20, wherein the a posteriori metrics are extrinsic a posteriori metrics.

27. The method of claim 20, wherein the metrics include log likelihood ratios.

28. The method of claim 20, wherein the metrics are cell state metrics.

29. The method of claim 20, wherein the metrics are bit metrics.

30. The method of claim 20, further comprising the step of:
(f) based at least in part on the at least one first cell distribution model parameter value, correcting the respective values of the operational parameters for cross coupling;
and wherein the assigning of the respective a priori metrics is based at least in part on the corrected values of the operational parameters.

31. The method of claim 20, further comprising the step of:
(f) based at least in part on the at least one first cell distribution model parameter value, correcting the respective values of the operational parameters for program disturb;
and wherein the assigning of the respective a priori metrics is based at least in part on the corrected values of the operational parameters.

32. The method of claim 20, further comprising the step of:
(f) for each cell, correcting the respective value of the operational parameter of the each cell, based at least in part on the at least one first cell distribution parameter value and on a respective measured value of an operational parameter of at least one neighbor of the each cell;
and wherein the assigning of the respective a priori metrics is based at least in part on the corrected respective values of the operational parameters.

33. The method of claim 20, wherein the first and second cell distribution model parameters are identical.

34. The method of claim 20, wherein the first and second cell distribution model parameters are different.

35. A memory device comprising:
(a) a plurality of cells;
(b) circuitry for measuring a respective value of an operational parameter of each cell; and
(c) a controller operative:
  (i) to instruct the circuitry to measure the values of the operational parameters,
  (ii) to provide a value of at least one first cell distribution model parameter of the plurality of cells,
  (iii) to assign each cell a respective a priori metric, based at least in part on the at least one cell distribution model parameter value;
  (iv) to decode the a priori metrics, thereby providing, for each cell, a respective a posteriori metric, and
  (v) to estimate a value of at least one second respective cell distribution model parameter of the plurality of cells, based at least in part on the a posteriori metrics and without repeating the instructing of the circuitry to measure the operational parameter values.

36. A memory controller, for a memory that includes a plurality of cells, the memory controller comprising:
(a) a measurement functional block for obtaining from the memory, for each cell, a measurement of a respective value of an operational parameter of the cell;
(b) an a priori metric functional block for assigning each cell a respective a priori metric;
(c) a decoder for decoding the a priori metrics, thereby providing, for each cell, a respective a posteriori metric; and
(d) a cell distribution model functional block for:
  (i) providing a value of at least one first cell distribution model parameter of the plurality of cells, the a priori metric of each cell then being based at least in part on the at least one cell distribution model parameter value, and
  (ii) estimating a value of at least one second respective cell distribution model parameter of the plurality of cells, based at least in part on the a posteriori metrics and without repeating the obtaining of the operational parameter value measurements from the memory.

37. A system for managing a first memory that includes a plurality of cells, the system comprising:
(a) a second memory for storing code for:
  (i) obtaining, from the first memory, for each cell, a measurement of a respective value of an operational parameter of the cell;
  (ii) providing a value of at least one first cell distribution model parameter of the plurality of cells,
  (iii) assigning each cell a respective a priori metric, based at least in part on the at least one cell distribution model parameter value,
  (iv) decoding the a priori metrics, thereby providing, for each cell, a respective a posteriori metric, and
  (v) estimating a value of at least one second respective cell distribution model parameter of the plurality of cells, based at least in part on the a posteriori metrics, and without repeating the obtaining of the operational parameter value measurements from the first memory; and
(b) a processor for executing the code.

38. A non-transitory computer readable storage medium having computer readable code embodied on the non-transitory computer readable storage medium, the computer readable code for managing a memory that includes a plurality of cells, the computer readable code comprising:
(a) program code for obtaining from the memory, for each cell, a measurement of a respective value of an operational parameter of the cell;
(b) program code for assigning each cell a respective a priori metric;
(c) program code for decoding the a priori metrics, thereby providing, for each cell, a respective a posteriori metric; and
(d) program code for:
  (i) providing a value of at least one first cell distribution model parameter of the plurality of cells, the a priori metric of each cell then being based at least in part on the at least one cell distribution model parameter value, and (ii) estimating a value of at least one second cell distribution model parameter, based at least in part on the a posteriori metrics and without repeating the obtaining of the operational parameter value measurements from the memory.

39. A method of reading a plurality of memory cells comprising:
(a) for each cell:
(i) measuring a respective value, of an operational parameter of the cell, that is indicative of a bit pattern stored in the cell, and
(ii) assigning the cell to a respective one of a plurality of cell populations;
(b) estimating a value of at least one respective cell distribution model parameter of each cell population; and
(c) constraining the estimating by requiring the bit patterns collectively to be a valid error correction codeword without repeating the measuring of the respective values of the operational parameters of any of the cells.

40. The method of claim 39, wherein the operational parameters are threshold voltages of the cells.

41. The method of claim 39, wherein, for at least one population, the estimating of the value of the at least one respective cell distribution model parameter of that population is based at least in part on the measured values of the operational parameters of the cells of that population.

42. A memory device comprising:
(a) a plurality of cells;
(b) circuitry for measuring a respective value, of an operational parameter of each cell, that is indicative of a bit pattern stored in the cell; and
(c) a controller operative:
(i) to instruct the circuitry to measure the values of the operational parameters,
(ii) to assign each cell to a respective one of a plurality of cell populations, and
(iii) to estimate a value of at least one respective cell distribution model parameter of each cell population, the estimating being constrained by requiring the bit patterns collectively to be a valid error correction codeword without repeating the instructing of the circuitry to measure the operational parameter values.

43. A memory controller, for a memory that includes a plurality of cells, the memory controller comprising:
(a) a measurement functional block for obtaining from the memory, for each cell, a measurement of a respective value, of an operational parameter of the cell, that is indicative of a bit pattern stored in the cell;
(b) an assignment functional block for assigning each cell to a respective one of a plurality of cell populations; and
(c) an estimation functional block for estimating a value of at least one respective cell distribution model parameter of each cell population, the estimating being constrained by requiring the bit patterns collectively to be a valid error correction codeword without repeating the measurement of the operational parameter values.

44. A system for managing a first memory that includes a plurality of cells, the system comprising:
(a) a second memory for storing code for:
(i) obtaining, from the first memory, for each cell, a measurement of a respective value, of an operational parameter of the cell, that is indicative of a bit pattern stored in the cell;
(ii) assigning each cell to a respective one of a plurality of cell populations, and
(iii) estimating a value of at least one respective cell distribution model parameter of each cell population, the estimating being constrained by requiring the bit patterns collectively to be a valid error correction codeword without repeating the instructing of the circuitry to measure the operational parameter values; and
(b) a processor for executing the code.

45. A non-transitory computer readable storage medium having computer readable code embodied on the non-transitory computer readable storage medium, the computer readable code for managing a memory that includes a plurality of cells, the computer readable code comprising:
(a) program code for obtaining from the memory, for each cell, a measurement of a respective value, of an operational parameter of the cell, that is indicative of a bit pattern stored in the cell;
(b) program code for assigning each cell to a respective one of a plurality of cell populations; and
(c) program code for estimating a value of at least one respective cell distribution model parameter of each cell population, the estimating being constrained by requiring the bit patterns collectively to be a valid error correction codeword without repeating the measurement of the operational parameter values.

46. A method of reading a plurality of memory cells, comprising:
(a) for each cell, measuring a respective value, of an operational parameter of the cell, that is indicative of a bit pattern stored in the cell;
(b) estimating a value of at least one cell voltage distribution parameter of the plurality of memory cells; and
(c) constraining the estimating by requiring the bit patterns collectively to be a valid error correction codeword without repeating the measuring of the respective values of the operational parameters of any of the cells.

47. The method of claim 46, wherein the operational parameters are threshold voltages of the cells.

48. The method of claim 46, wherein the estimating of the value of the at least one cell distribution model parameter is based at least in part on the measured values of the operational parameters.

49. A memory device comprising:
(a) a plurality of cells;
(b) circuitry for measuring a respective value, of an operational parameter of each cell, that is indicative of a bit pattern stored in the cell; and
(c) a controller operative:
(i) to instruct the circuitry to measure the values of the operational parameters, and
(ii) to estimate a value of at least one cell distribution model parameter of the plurality of cells, the estimating being constrained by requiring the bit patterns collectively to be a valid error correction codeword without repeating the instructing of the circuitry to measure the operational parameter values.

50. A memory controller, for a memory that includes a plurality of cells, the memory controller comprising:
 (a) a measurement functional block for obtaining from the memory, for each cell, a measurement of a respective value, of an operational parameter of the cell, that is indicative of a bit pattern stored in the cell; and
 (b) an estimation functional block for estimating a value of at least one cell distribution model parameter of the plurality of cells, the estimating being constrained by requiring the bit patterns collectively to be a valid error correction codeword without repeating the measurement of the operational parameter values.

51. A system for managing a first memory that includes a plurality of cells, the system comprising:
 (a) a second memory for storing code for:
  (i) obtaining, from the first memory, for each cell, a measurement of a respective value, of an operational parameter of the cell, that is indicative of a bit pattern stored in the cell; and
  (ii) estimating a value of at least one cell distribution model parameter of the plurality of cells, the estimating being constrained by requiring the bit patterns collectively to be a valid error correction codeword without repeating the measurement of the operational parameter values; and
 (b) a processor for executing the code.

52. A non-transitory computer readable storage medium having computer readable code embodied on the non-transitory computer readable storage medium, the computer readable code for managing a memory that includes a plurality of cells, the computer readable code comprising:
 (a) program code for obtaining from the memory, for each cell, a measurement of a respective value, of an operational parameter of the cell, that is indicative of a bit pattern stored in the cell; and
 (b) program code for estimating a value of at least one cell distribution model parameter of the plurality of cells, the estimating being constrained by requiring the bit patterns collectively to be a valid error correction codeword without repeating the measurement of the operational parameter values.

* * * * *